(12) United States Patent
Pfaff

(10) Patent No.: US 6,367,763 B1
(45) Date of Patent: Apr. 9, 2002

(54) TEST MOUNTING FOR GRID ARRAY PACKAGES

(76) Inventor: Wayne K. Pfaff, 309 Steeplechase, Irving, TX (US) 75062

( * ) Notice: Subject to any disclaimer, the term of this patent is extended or adjusted under 35 U.S.C. 154(b) by 0 days.

(21) Appl. No.: 09/584,979

(22) Filed: Jun. 2, 2000

(51) Int. Cl.[7] .............................................. F16M 13/00
(52) U.S. Cl. ..................................................... 248/618
(58) Field of Search ................................ 248/618, 628, 248/635, 27.3, 346.02, 228.5

(56) References Cited

U.S. PATENT DOCUMENTS

| | | | |
|---|---|---|---|
| 4,491,377 A | 1/1985 | Pfaff | 339/74 R |
| 4,618,199 A | 10/1986 | Pfaff | 339/74 R |
| 4,869,674 A | 9/1989 | Pfaff | 439/70 |
| 5,108,302 A | 4/1992 | Pfaff | 439/266 |
| 5,772,451 A * | 6/1998 | Dozier, II et al. | 439/70 |
| 6,016,254 A | 1/2000 | Pfaff | 361/769 |
| 6,124,720 A | 9/2000 | Pfaff et al. | 324/755 |
| 6,229,209 B1 * | 5/2001 | Nakamura et al. | 257/737 |
| 6,232,149 B1 * | 5/2001 | Dozier, II et al. | 438/117 |

FOREIGN PATENT DOCUMENTS

JP         8-88061    *  4/1996    ................... 23/68

* cited by examiner

*Primary Examiner*—Ramon O. Ramirez
*Assistant Examiner*—A. Joseph Wujciak
(74) *Attorney, Agent, or Firm*—Dennis T. Griggs

(57) ABSTRACT

A simple, inexpensive burn-in and test mounting for high terminal density grid array packages is formed by a support base which carries a plurality of C-shaped spring finger contacts. One end of each spring finger contact is attached to the first face of the support base at the edge of a hole corresponding to the outline of the LGA package and extends through the hole. The contacts are curved so that the second end of each contact is supported above and spaced from the opposite side of the support base. Each spring finger is curved to define a knee which lies in a plane parallel with the faces of the support base. The spring fingers are arranged so that the knees are in register with lands on an LGA package. When the LGA package is moved toward the support base, the knees contact the lands on the LGA package. Electrical communication may be established with either end of the finger, thus permitting spreading of input/output terminal connections.

5 Claims, 1 Drawing Sheet

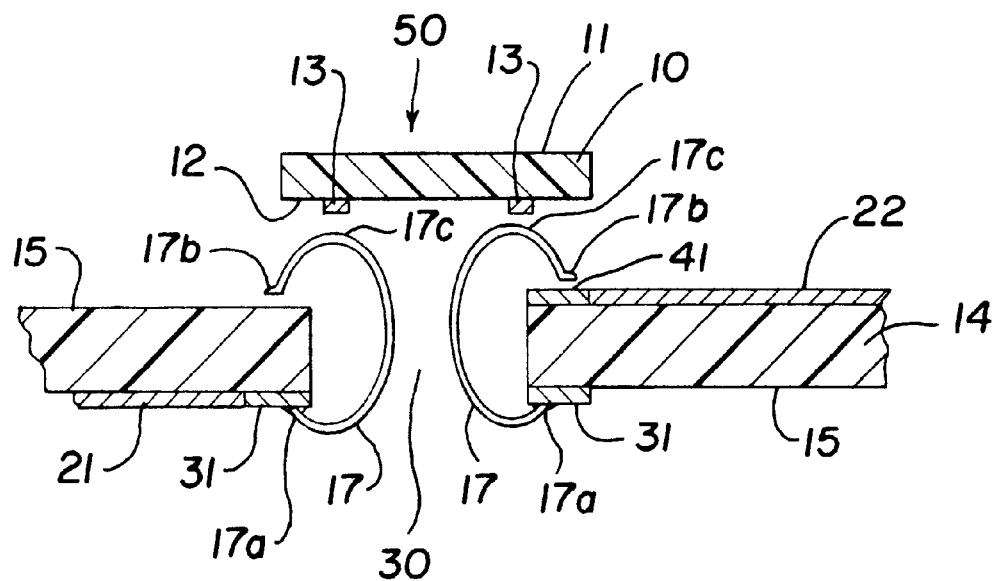

TEST MOUNTING FOR GRID ARRAY PACKAGES

This invention relates to burn-in and test of electronic devices in surface mount packages. More particularly, it relates to methods and apparatus for temporary mounting and holding electronic device packages for burn-in and/or test and to establishing and maintaining positive electrical contact to closely spaced input/output terminal lands or leads on such packages without damaging the electronic device, the device package, its interconnection terminals or the test socket and without introducing unnecessary signal distortion.

Advances in microelectronics technology tend to develop electronic device chips and packages which occupy less space while performing more functions faster. As a result, the number of electrical interconnections between the device package and external circuitry required for the circuits in the chips to communicate with the outside world increases and the physical size of each such interconnection must decrease.

In order to provide electrical communication between the chip and external circuitry, circuit chips are usually contained within a housing or package which supports interconnection pads or lands, leads, balls, etc., on one or more of its external surfaces. In order to reduce overall lead length from chip to external circuitry and to provide adequate spacing between input/output terminals on the package, high pin count devices are sometimes mounted in packages in which the input/output terminals are in the form of conductive lands or pads formed on one or more faces of the package. The lands are often arranged in rows parallel with and adjacent peripheral edges of one face with the surfaces of the lands coplanar and parallel with (but slightly below) the bottom surface of the package. The lands may be arranged in other patterns such as parallel rows which cover the entire bottom surface in a grid pattern; lands grouped near the center of the bottom surface; or various combinations of such arrangements. Such device packages (commonly known as land grid array or LGA packages) may thus be mounted on circuit patterns on the surface of a circuit board or the like so that the terminal lands are bonded to mating lands or pads on the board.

In some device packages terminal balls may be formed on or substituted for the lands. Terminal balls are usually a quantity of solder which has been heated so that it forms a spherical liquid by surface tension and thus forms a ball-like protrusion extending from the face of the device package. Such device packages (commonly known as ball grid array or BGA packages) may likewise be mounted to circuit patterns on the surface of a circuit board or the like by bonding the solder balls to mating lands or pads on the board.

In many cases it is desirable that the completed device package be subjected to test and/or burn-in prior to acceptance and assembly onto a circuit board. While the terminal lands may be directly and permanently surface mounted on a circuit board by soldering, it is much more difficult to establish and maintain temporary electrical contact with each land without destroying or damaging the land, the package or the encapsulated circuit chip. In order to reliably test and burn-in such packages, the package must be temporarily mounted in a re-useable socket or other mounting apparatus which makes precision interconnection between the input/output lands and outside circuitry without introducing signal distortion problems and without physically damaging the device package.

As the size of the package decreases and the number of lands increases, the size and spacing of lands become smaller. Smaller and more closely spaced lands are, of course, more difficult to contact with test probes or the like. Furthermore, long or massive contact pins cannot be used for connecting external circuitry to the input/output lands for testing when high frequency devices are involved because such contact pins, particularly when closely spaced in order to contact closely spaced lands, introduce unacceptable signal distortion.

Conventional burn-in and test apparatus employs test sockets mounted on a burn-in board with the pin-out leads of the test or burn-in socket passing through the bottom of the socket and through holes in a circuit board in conventional through-hole mountings. Interconnection of high frequency devices with outside circuitry using such conventional mountings can induce unacceptable signal distortion because of the high density of parallel terminal leads passing through the board. More recently, miniaturized surface mount device packages have been devised which have very closely-spaced input/output terminal lands on one face of the package. Such device packages, because of their extremely small size, configuration and physical construction, are most difficult to handle without causing damage, yet good electrical contact with all the input/output terminal lands is essential. It is therefore desirable that apparatus be devised in which such small packages may be easily temporarily mounted (preferably by automation) and tested and/or stress-tested by burn-in and the like without damaging the device package or introducing signal distortion problems.

In accordance with the present invention reliable precise electrical contact is provided between input/output lands on small LGA packages (or balls on BGA packages) and external circuitry by mounting apparatus which employs a support base and contact pins in the form of curved spring fingers which are attached to one face of the support base and extend around the end of (or through a hole in) the support base so that the other end is suspended over the opposite face of the support base. The contact pin is curved in the form of a C to define a curved surface or knee which projects above the opposite face of the support base. The knee is adapted to engage the input/output lands on an LGA package positioned adjacent the opposite face of the support base. The support base is formed of electrically insulating material and carries a set of conductive traces connected to terminal lands which correspond in number and general location with the terminal land arrangement of the LGA package to be tested.

One end of each contact finger is securely attached to the first face of the support base and the spring finger is curved so that its opposite end may only move a very short distance before contacting the opposite face. The contact fingers, however, are precisely aligned with the input/output lands on the device package under test. Since the contact fingers are very short and sharply curved, extremely small diameter wire can be used to form reliably precise contact fingers to contact very small and closely spaced terminal lands. Since the contact fingers are very small and relatively short, they have very little mass. Capacitance-induced, inductance-induced and impedance-induced signal distortion are thus minimized. More significantly, the physical distance (the lead length) between the input/output land and the external circuitry to which it is connected by the contact pin is minimized. Thus the interconnection arrangement of the invention may be used for test and burn-in of extremely high frequency devices in packages employing very closely spaced terminal lands without introducing signal distortion problems. Because of the simplicity of design and operation, the mounting apparatus of the invention may be made from a wide variety of readily available materials. Since the socket is loaded from the top, automated processes may be employed to load and unload the socket without damage to the device package or the socket and the top surface of the device package is exposed for cooling and/or attachment of a heat sink. Because of the simplicity of design, sockets employing the invention may be mass produced quite inexpensively. Other features and advantages of the invention will become more readily understood from the following detailed description taken in connection with the appended claims and attached drawing in which the sole FIGURE is an exploded schematic representation, partially in section, of an LGA device package and mounting apparatus assembly employing the principles of the invention.

The drawing is incorporated into and forms part of this specification to illustrate exemplary embodiments of the invention. Throughout the drawing like reference numerals designate corresponding elements. It will be recognized that the principles of the invention may be utilized and embodied in many and various forms. In order to demonstrate these principles, the invention is described herein by reference to specific preferred embodiments. The invention, however, is not limited to the specific forms illustrated and described. Furthermore, the invention is not limited to use in connection with LGA packages of the type illustrated in the drawing. For example, the invention is described herein with specific reference to use in connection with LGA and BGA packages with a single row of lands or balls adjacent the periphery of the bottom face. However, sockets or other mounting apparatus employing the principles of the invention may be designed and used to mount, test and burn-in device packages employing any of a wide variety terminal arrangements. The lands or balls may, for example, be arranged in multiple rows, in centralized groups or in a full grid array. Furthermore, for purposes of this invention the terminal balls on BGA device packages may be treated as lands on LGA device packages. Therefore, the terms "land" and "lands" used in reference to a device package should be construed to include input/output lands on LGA packages and input/output terminal balls on BGA packages. In addition, the mounting apparatus may be designed to accommodate leaded device packages wherein the leads, at some point during fabrication, have a configuration in which the leads may be contacted from the underside (such as packages wherein the leads are held in a molded carrier ring). Sockets may also be designed to contact the underside of leads extending from dual inline packages, gullwing packages or various other packages before (or after) the terminal leads are formed into their final configuration. It is only necessary that the package under test presents a plurality of coplanar lands or terminal lead surfaces which may be directly contacted from the underside of the package by vertically extending contact pins which electrically connect circuitry on the surface of an external board and the terminal ball, land or lead on the device package.

It should also be understood that the invention is not limited to mounting devices for conventional encapsulated packages. For example, input/output terminal lands are sometimes formed on bare chips or flip chip devices to form electrical interconnection with other chips or support media in multi-chip encapsulation packages. For example, a plurality of bare chips having terminal lands are sometimes mounted on a single support mounted within a single encapsulation package. It is often desirable to test these chips prior to assembly so that only "known good die" are ultimately mounted in the multi-chip arrangement. All such chips are characterized by having input/output lands on one face thereof and may be mounted in test sockets employing the principles of the invention. Accordingly, as used herein the term "LGA package" includes any package or chip, whether encapsulated or not, which employs a plurality of substantially coplanar input/output terminal balls, lands or leads extending in a plane substantially parallel with one face of the chip or package which may be physically contacted by a contact pin which extends in a direction normal to the plane of the bottom surface of the terminal lands, balls or leads. The terms "mounting apparatus" and "socket" are used synonymously herein to describe any device or apparatus for holding such LGA packages while providing electrical communication between its terminals and external circuitry such as a circuit board, burn-in board or the like.

In the embodiment illustrated in the drawing, mounting apparatus is formed using a support base 14 which has a hole 30 therein substantially conforming to the outline of the device package to be tested. It will be understood that hole 30 may be a hole in a single piece of insulating material or defined by two or more separate pieces of support base 14 arranged to define a gap 30 therebetween. Obviously, where the lands to be contacted are arranged in rows parallel with all four edges of the device package, the hole 30 will be rectangular and contact pins (spring fingers 17) arranged to extend through hole 30 along all four sides of the hole 30.

An LGA package 10 is positioned above hole 30. As illustrated in the drawing, LGA package 10 has a top surface 11 and a bottom surface 12 on which is arranged a plurality of lands 13. Lands 13 may, of course, be arranged in a single row (as illustrated) or in multiple rows. Obviously, lands 13 may be flat lands, balls or the underside of conventional leads as described hereinabove. In a commercial embodiment, the support base 14 will be part of a socket or the like which includes guides (not shown) for orienting the device package 10 and closure means (illustrated by arrow 50) to urge the lands 13 into contact with the spring fingers 17.

A plurality of substantially C-shaped spring finger contact pins 17 is attached to the first face 15 of support base 14 and arranged along the edges of the hole 30 so that the contact pins 17 extend through the hole 30 (or around the edge of support base 14). The first end 17a of each contact pin 17 is secured to the first face 15. The C-shaped pin 17 extends through hole 30 and curves back over the second face 16 of support base 14. In the relaxed position (as illustrated in the drawing), each pin 17 defines a contact knee 17c (the point at which the curved pin 17 projects farthest from first end 17a) which lies in a plane parallel with but spaced from the second face 16 of the support base 14 in the direction opposite the first face 15. The plane of contact knees 17c thus lies above and spaced from the plane of second face 16 of the support base. The second end 17b of each contact pin is suspended above but spaced from the second face 16 by a short distance.

In the preferred embodiment contact pin 17 is a highly conductive resilient wire such as gold-plated steel, beryllium-copper alloy or the like. In order to make precision contact with lands arranged on 0.5 mm centers, the diameter of each pin 17 must be no greater than about 0.2 mm. The first end 17a of each pin 17 may be attached to a plated land 31 or the like by conventional means such as soldering. Since the pins 17 are fairly short and formed in a C-shaped curve, alignment and registry of the knees 17c with the land 13 is readily obtained and maintained.

It will be recognized that when LGA package 10 is moved downwardly (toward the support base 14), lands 13 are urged into individual contact with knees 17c. Further pressure bends the contact pins 17 until the second ends 17b thereof contact the second surface of support base 14. Such bending causes each knee 17c to scrape the surface of the land 13 with which it is in contact to slightly abrade its surface and assure good electrical contact. The distance between the second ends 17b of the pins 17 and second face 16 of the support base 14, however, precisely limits the degree of movement.

As illustrated on the left-hand side of the drawing, a conductive trace 21 may be formed on the first face 15 of support base 14 to provide electrical communication between the plated land 31 supporting pin 17 and external circuitry. Alternatively, conductive traces 22 may be formed on the second surface 16 of support base 14 which form electrical contact with contact pads 41 formed on second surface 16 immediately below the second ends 17b of contact pins 17 (see the right-hand side of the drawing). In this construction, urging the land 13 against knee 17c forces second end 17b into contact with pad 41. In the preferred embodiment, contact arrangement as shown in the left-hand side (bottom face pin-out) and that shown in the right-hand side (top face pin-out) are alternated so that adjacent lands 13 are placed in electrical contact with circuitry 21, 22 on opposite sides of the support base, thus spreading the input-output circuitry terminals and avoiding closely spaced parallel input/output terminal connections with external circuitry. Spreading the input/output terminals also makes interconnection with outside circuitry much easier to maintain and much more reliable.

It will be readily apparent that the C-shaped spring figures may take other forms. The C-shape, however, conveniently permits forming electrical connection between lands on an LGA package and either end of the contact spring finger using a minimum length of wire for the spring finger. The ability to provide electrical communication with either end of the spring finger permits spreading of the input/output interconnectors.

It will also be recognized that the principles of the invention may be readily incorporated into a wide variety of sockets or other mounting apparatus, the details of which form no part of the present invention.

It will be apparent from the foregoing that the principles of the invention may be used to mount and form temporary electrical contact with the terminal leads or lands of various device packages without risk of damaging the device or its input/output terminals. Because of the unique structure, mounting apparatus employing the invention may be easily and inexpensively manufactured. Only simple tooling and manufacturing processes are required to make mounting apparatus which may be used for burn-in and/or test of high frequency devices without concern for signal distortion introduced by the test socket or its interconnection with the burn-in board or other support media. It is to be understood, however, that even though numerous characteristics and advantages of the invention have been set forth in the foregoing description together with details of the structure and function of various embodiments, this disclosure is to be considered illustrative only. Various changes and modifications may be made in detail, especially in matters of shape, size, arrangement and combination of parts, without departing from the spirit and scope of the invention as defined by the appended claims.

What is claimed:

1. Apparatus for mounting an LGA package having a plurality of terminal lands or leads with surfaces extending in a plane substantially parallel with one face of the LGA package comprising:

(a) a support base having oppositely disposed first and second faces lying in substantially parallel planes;

(b) a plurality of substantially C-shaped contact pins, each having a first end, a second end and a contact knee intermediate said first end and said second end with the first end of each contact pin secured to said first face, the second end of each contact pin suspended above said second face and said contact knee lying in a plane parallel with but spaced from said second face in the direction opposite said first face, with said contact knees arranged in a pattern corresponding to the pattern of the lands or leads on an LGA package;

(c) contact pads connected to conductive circuitry on said second face wherein said contact pads are arranged and aligned in register with the second ends of at least some of said contact pins;

(d) circuitry on the first face of said support base in electrical contact with the first ends of at least some of said contact pins; and (e) means for urging the lands or leads of said LGA package uniformly into contact with the knees of said contact pins sufficiently to bend the contact pins and urge the second ends of said contact pins toward the plane of the second surface of said support base.

2. Apparatus as defined in claim 1 wherein the second ends of alternate ones of said plurality of contact pins contact a contact pad on said second surface when said second ends are urged toward the plane of said second surface of said support base.

3. Apparatus as defined in claim 1 wherein the first ends of alternate ones of said plurality of contact pins are in electrical communication with circuitry on the first face of said support base.

4. Apparatus as defined in claim 1 wherein said C-shaped contact pins extend from said first face and around an end of said support base.

5. Apparatus as defined in claim 1 wherein said C-shaped contact pins extend from said first face and through a hole in said support base.

* * * * *